(12) United States Patent
Shiota et al.

(10) Patent No.: US 7,729,068 B2
(45) Date of Patent: Jun. 1, 2010

(54) POLYMER ACTUATOR AND OPTICAL UNIT

(75) Inventors: Natsuko Shiota, Ibaraki (JP); Shigeru Wada, Kishiwada (JP); Yoshihiro Hara, Takatsuki (JP)

(73) Assignee: Konica Minolta Holdings, Inc., Tokyo (JP)

( * ) Notice: Subject to any disclaimer, the term of this patent is extended or adjusted under 35 U.S.C. 154(b) by 120 days.

(21) Appl. No.: 12/034,890

(22) Filed: Feb. 21, 2008

(65) Prior Publication Data
US 2008/0204909 A1    Aug. 28, 2008

(30) Foreign Application Priority Data
Feb. 27, 2007    (JP) .............. 2007-046911

(51) Int. Cl.
*G02B 7/02* (2006.01)
(52) U.S. Cl. .................................... 359/824
(58) Field of Classification Search ............ 359/824
See application file for complete search history.

(56) References Cited

U.S. PATENT DOCUMENTS

| | | | |
|---|---|---|---|
| 5,161,128 A * | 11/1992 | Kenney | 367/181 |
| 2006/0208610 A1* | 9/2006 | Heim | 310/311 |
| 2007/0122132 A1* | 5/2007 | Misawa et al. | 396/55 |
| 2007/0200468 A1* | 8/2007 | Heim | 310/800 |
| 2009/0161239 A1* | 6/2009 | Verhaar et al. | 359/824 |

FOREIGN PATENT DOCUMENTS

| | | |
|---|---|---|
| JP | 2003-505865 A | 2/2003 |
| JP | 2004-282992 A | 10/2004 |
| WO | WO 0106575 A1 * | 1/2001 |

* cited by examiner

*Primary Examiner*—Jessica T Stultz
*Assistant Examiner*—Mahidere S Sahle
(74) *Attorney, Agent, or Firm*—Sidley Austin LLP

(57) ABSTRACT

An object of the present invention is to provide a polymer actuator that does not need a special member for determining the output direction of the drive force or a support member, and which is simply configured with a small number of parts and is compact and low-cost. The present invention provides a polymer actuator that includes electrodes which are inelastic in a planar direction and sandwich a stretching portion of a dielectric polymer with a gradient in thickness, and also provides an optical system including the polymer actuator.

14 Claims, 8 Drawing Sheets

PRIOR ART

POLYMER ACTUATOR AND OPTICAL UNIT

This application is based on Japanese Patent Application No. 2007-046911 filed on Feb. 27, 2007, in Japanese Patent Office, the entire content of which is hereby incorporated by reference.

TECHNICAL FIELD

The present invention relates to a polymer actuator and an optical unit, and in particular to a polymer actuator comprising an electrode formed of a stretching portion that has a gradient in thickness and of a material which is inelastic in a planar direction, and to an optical unit including the polymer actuator.

BACKGROUND

The optical unit that is mounted in cellular phones and the like is required to be simultaneously compact, low in cost and high in functionality. High functionality herein refers to loading of functions such as "autofocus function" that is realized in digital cameras, and in order to realize these functions, an actuator for moving the photographing lens is required.

On the other hand, in order to make the device compact, the members added for providing the aforementioned high functionality, such as the actuator in particular, as well as the conventional functions are required to be compact. Thus, improvement of spatial efficiency at the level of all parts is critical. Furthermore, in order to cut cost, cutting cost by making assembly easy is also important as well as lowering the cost of the parts.

In view of those issues, the polymer actuator has gathered much attention as one of actuators in recent years. The polymer actuator generates a great force, is light in weight, noiseless and can be driven by low power, and because the material is made of resin, it can be formed in any shape by molding.

For example, it has been proposed that a drive section of the calibration device for an image pickup apparatus equipped with a handshaking correction function can be configured by using the polymer actuator as a drive source (See Unexamined Japanese Patent Application Publication No. 2004-282992).

In addition, proposed is a method in which different pre-strain depending on directions is applied to the polymer in order to control the output direction of the polymer actuator (See Japanese National Publication No. 2003-505865).

However, Unexamined Japanese Patent Application Publication No. 2004-282992 only states that the polymer actuator is suitable for a drive section of the calibration device of the image pickup apparatus that has the handshake correction function, but does not propose any specific means or methods, and there is no evidence of feasibility.

In addition, in the method of the Japanese Translation of PCT International Application Publication No. 2003-505865, a fixing member for fixing the stretched polymer is necessary in order to apply pre-strain, which means there still remain the problems in realizing compactness and low cost.

SUMMARY

The present invention was conceived in view of the above situation, and an object thereof is to provide a polymer actuator that has a simple structure and a small number of parts and is also compact and low-cost. An object is also to provide an optical unit that includes the polymer actuator.

In view of forgoing, one embodiment according to one aspect of the present invention is a polymer actuator, comprising:
  a stretching portion which is made of a dielectric polymer material; and
  a pair of electrodes for sandwiching the stretching portion and applying an electric field to the stretching portion,
  wherein the stretching portion has a gradient in thickness sandwiched between the electrodes.

According to another aspect of the present invention, another embodiment is an optical unit, comprising:
  an optical system;
  a frame member for supporting the optical system; and
  a polymer actuator for moving the member, the polymer actuator including:
    a stretching portion which is made of a dielectric polymer material; and
    a pair of electrodes for sandwiching the stretching portion and applying an electric field to the stretching portion,
    wherein the stretching portion has a gradient in thickness sandwiched between the electrodes.

DETAILED DESCRIPTION OF THE PREFERRED EMBODIMENT

Figure 1A:
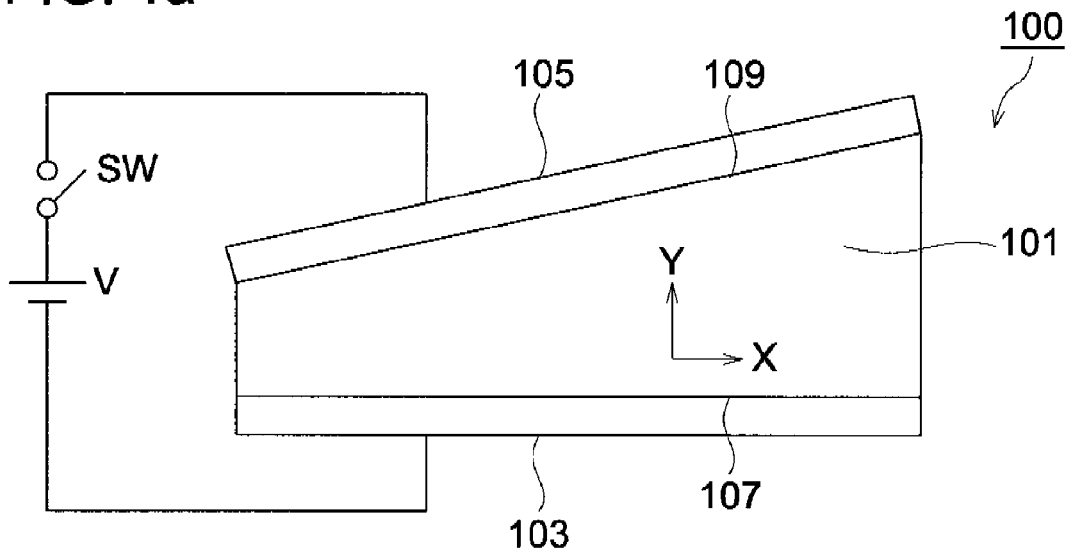
FIGS. 1a, 1b and 1c are pattern diagrams showing a polymer actuator according to a first embodiment of the present invention.

The following is a description of the present invention based on the embodiments shown in the drawings, but the present embodiment is not to be limited to these embodiments. It is to be noted that in the drawings the same numbers have been assigned to the same or equivalent parts and repeated descriptions thereof have been omitted.

Figure 8:
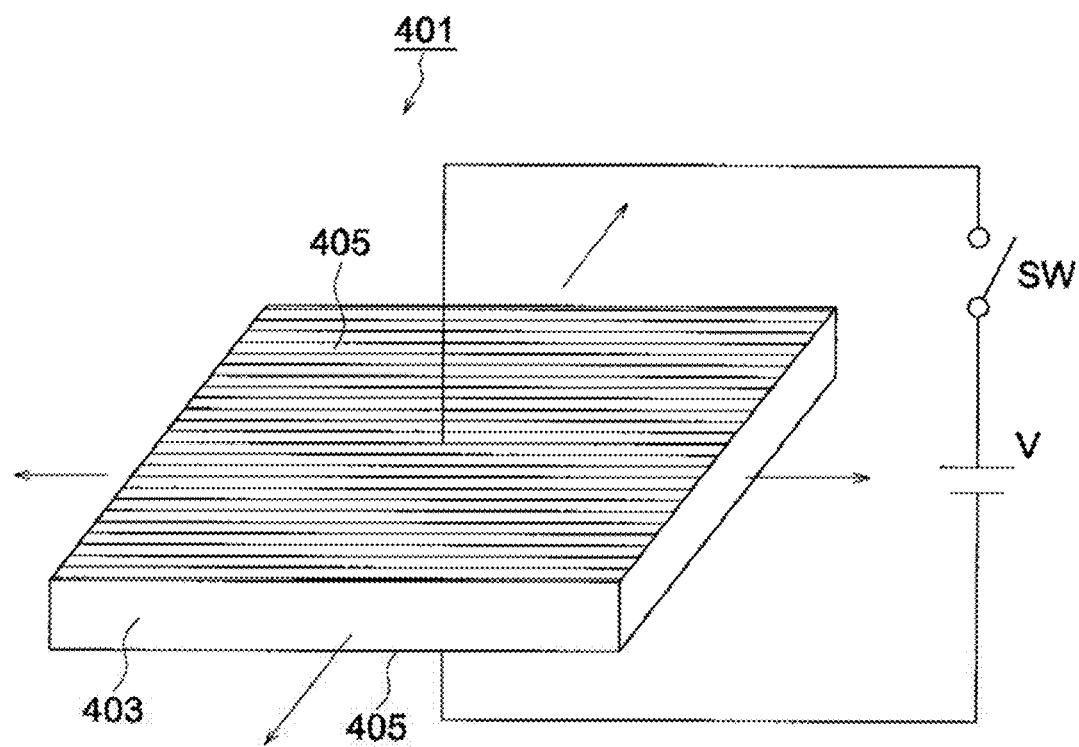
FIG. 8 is a pattern diagram for describing the operational principle for a polymer actuator of the prior art.

First, the operational principles of a polymer actuator of the prior art will be described using FIG. 8. FIG. 8 is a pattern diagram for describing the operational principle for the polymer actuator of the prior art.

In FIG. 8, a polymer actuator 401 comprises a stretching portion 403 formed of a dielectric polymer material called a dielectric elastomer such as silicon rubber and the like, and comprises a polymer electrode 405, which is mixed with conductive carbon particles, provided on the both surfaces of the stretching portion 403. When a switch SW is closed and potential difference V is applied to an electrodes 405 provided on both surfaces of the stretching portion 403, electrostatic force acts to cause the electrodes to attract each other, and as a result, the stretching portion 403 which is formed of a dielectric polymer, which is an elastic material, is stretched in the arrow direction in the drawing. The size of the stretching is substantially proportional to the size of the electric field generated by the applied potential difference.

When one or both sides of the electrode 405 are used as partial electrodes, only the stretching portion 403 underneath the partial electrode stretches. Accordingly, by dividing the electrode 405 into a plurality of partial electrodes and driving each electrode separately, it becomes possible to form a so-called actuator array in which a plurality of polymer arrays are arranged. The polymer actuator is characterized in that it generates a great force, is light in weight, noiseless and can be driven by low power, and because the material is made of resin, it can be formed in any shape by molding, and a plurality of actuators can be formed integrally.

Figure 1B:
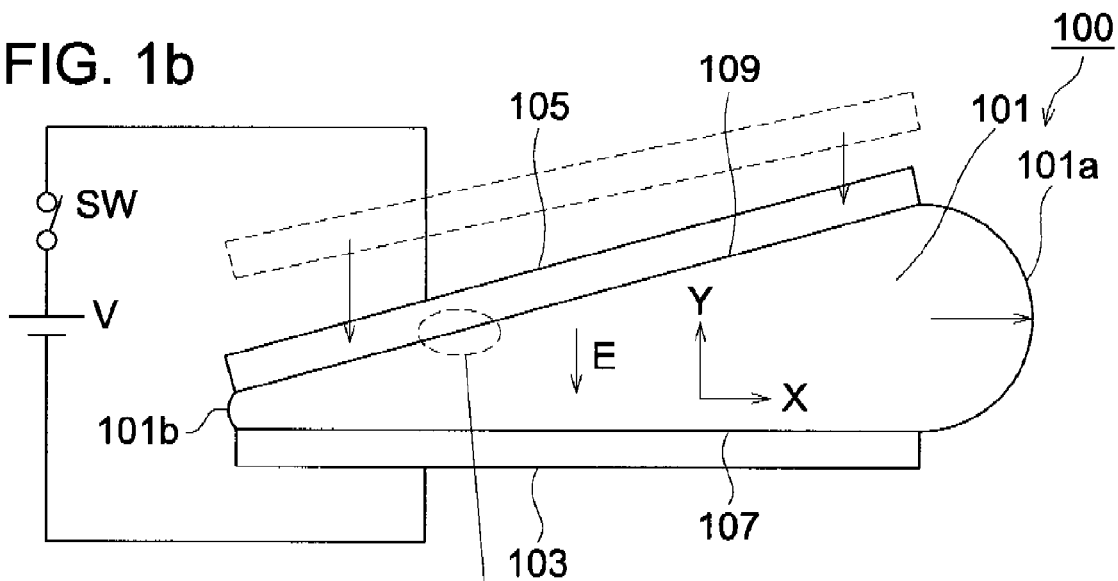
Figure 1C:
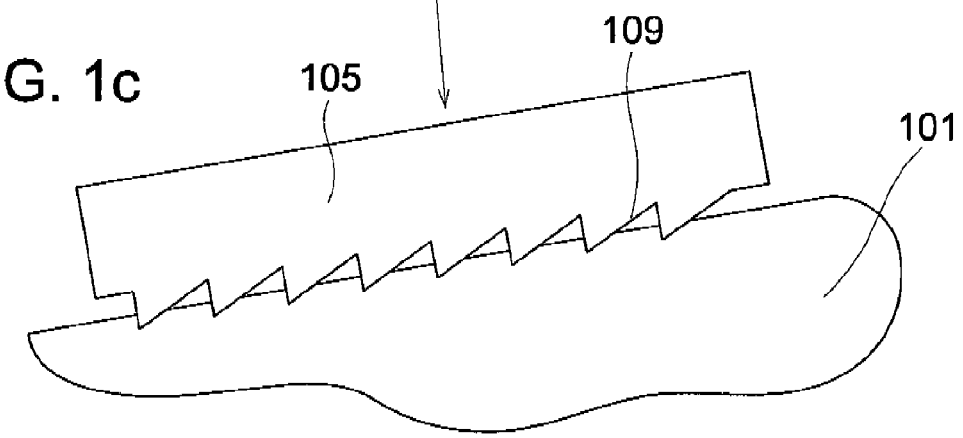

Next, a first embodiment of the polymer actuator of the present invention will be described using FIGS. 1a, 1b and 1c. FIGS. 1a, 1b and 1c are pattern diagrams showing the first embodiment of the polymer actuator. FIG. 1a shows the polymer actuator without application of electric field while FIG. 1b shows it with application of electric field.

In FIG. 1a, the polymer actuator 100 comprises a stretching portion 101 formed of a dielectric polymer material, and a lower surface electrode 103 and an upper surface electrode 105 which function as the electrodes of the present invention. The stretching portion 101 has a trapezoidal cross-section and thickness in the direction sandwiched between the lower electrode 103 and the upper electrode 105 has a continuous gradient. The lower surface electrode 103 and the upper surface electrode 105 are formed of a conductive material such as metal or the like or formed of the conductive material with a supporting member stacked thereon. The electrodes are bonded with adhesion to the stretching portion 101 via the bonding surfaces 107 and 109.

Actually, the lower surface electrode 103 and the upper surface electrodes 105 which are the electrodes of the present invention may be selected as needed from, for example, a metal substrate, a glass plate with a vapor-deposited metal thereon, a plastic plate with a metal foil bonded thereon, and a conductive plastic plate and the like. In addition, the lower surface electrode 103 or the upper surface electrodes 105, or alternatively both of these electrodes preferably do not stretch in the planar direction of the electrode surface when the stretching portion 101 deforms. This arrangement reduces the phenomenon in which the drive efficiency of the actuator is lowered by the deformation of the stretching portion 101 in a direction other than the desired direction. Furthermore, it is preferable that these electrodes are rigid. When the electrodes are rigid, it becomes possible to prevent warping of the electrode portion due to deformation of the stretching portion 101, and it can be expected that driving efficiency can be further improved. The level of rigidity is set such that the lower surface electrode 103 or the upper surface electrode 105 do not substantially bend under the actual driving conditions of the polymer actuator 100.

In FIG. 1b, when the switch SW is closed to apply potential difference V to the lower surface electrode 103 and the upper surface electrodes, the electrostatic attraction force caused by the electric field E due to the potential difference V causes the electrodes to attract each other. The electrostatic force is inversely proportional to the square of the gap between the electrodes. Therefore, the electrodes attract each other more strongly, and the gap between the electrodes gets narrowed further in the area where the gap is small (the left side portion of the drawing) than in the area where the gap is large (the right side portion of the drawing).

The deformation of the stretching portion 101 caused by being pushed by the lower surface electrode 103 and the upper surface electrode 105 pushes the stretching portion 101 to be projected in the +X direction in the drawing. The projected portion of the stretching portion 101 is called an output portion 101a. The stretching portion 101 stretches into a portion 101b opposite to the output portion 101a, but because the portion 101b opposite to the output portion 101a has a smaller gap of the electrodes, the amount of projection is very small. Thus in the first embodiment, the output direction of the drive force of the polymer actuator is the +X direction of drawing which is perpendicular to the electric field E.

In the polymer actuator 401 shown in FIG. 8, the electrodes 405 as well as the stretching portions 403 are elastic material, and thus the electrode 405 stretches along with the stretching portion 403. But in the polymer actuator 100 of the first embodiment, the lower surface electrode 103 and the upper surface electrode 105 are both formed of rigid material, and thus they do not deform, and only the stretching portion 101 stretches to project in the +X direction of the drawing, and driving force is output in the direction of the stretching.

In addition, as described above, the electrostatic force that acts between the electrodes is stronger and the in the left side portion of the drawing, where the gap of the electrode is smaller, than in the right side portion of the drawing, where the gap of the electrodes is wider. Thus the output direction of the driving force of the polymer actuator 100 of the first embodiment is determined by the shape of the stretching portion 101, and a special member or the like for determining the output direction is not necessary.

Furthermore, the lower surface electrode 103 and the upper surface electrode 105 are formed of a rigid material, and there is no need for a support member such as a housing and the like for supporting the stretching portion 101, the lower surface electrode 103, and the upper surface electrode 105. In addition, in the above example, the lower surface electrode 103, the upper surface electrode 105, and the stretching portion 101 are bonded by adhesion and the like, but as shown in FIG. 1c as enlarged, instead of adhesion, the bonding surface 107 and 109 of the lower surface electrode 103 and the upper surface electrode 105 may be formed to be serrated to mesh with the stretching portion to be firmly bonded.

As described above, the first embodiment comprises the stretching portion 101 which has a gradient in thickness and the lower surface electrode 103 and the upper surface electrode 105 which are formed of a rigid material, where the lower surface electrode 103 and the upper surface electrode 105 are bonded to the stretching portion 101. With this arrangement, there is provided the compact and low-cost polymer actuator 100 which is simply configured with a small number of parts without need for a support member or a special member for determining the output direction.

Figure 2A:
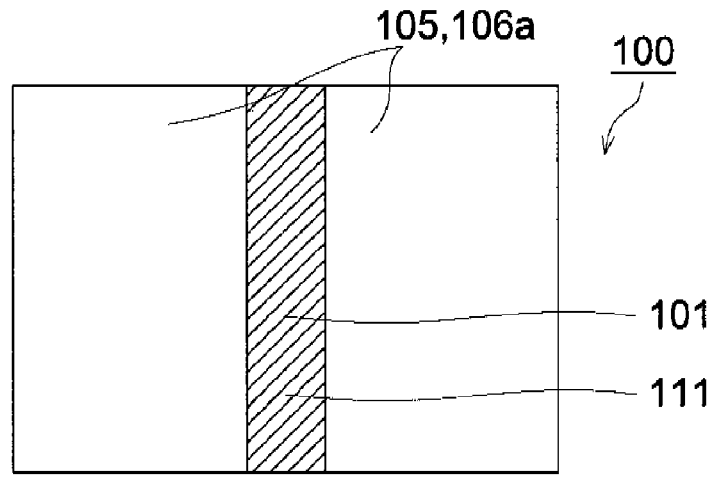
FIGS. 2a, 2b and 2c are pattern diagrams showing a polymer actuator according to a second embodiment of the present invention.
Figure 2B:
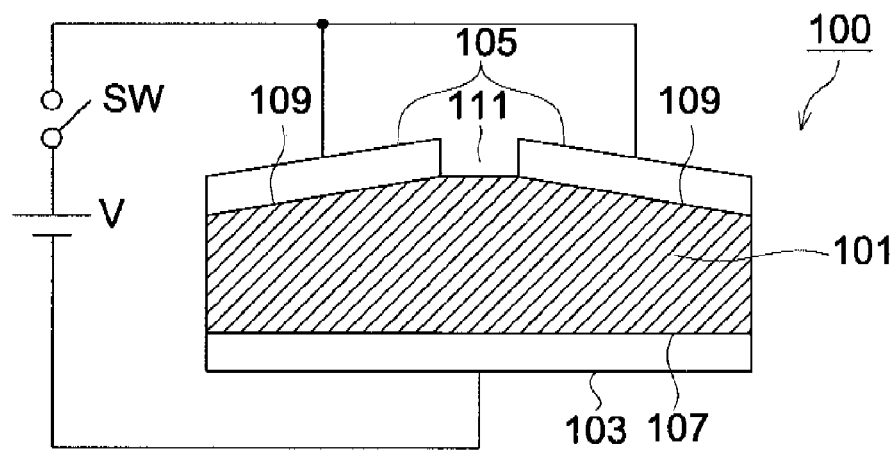
Figure 2C:
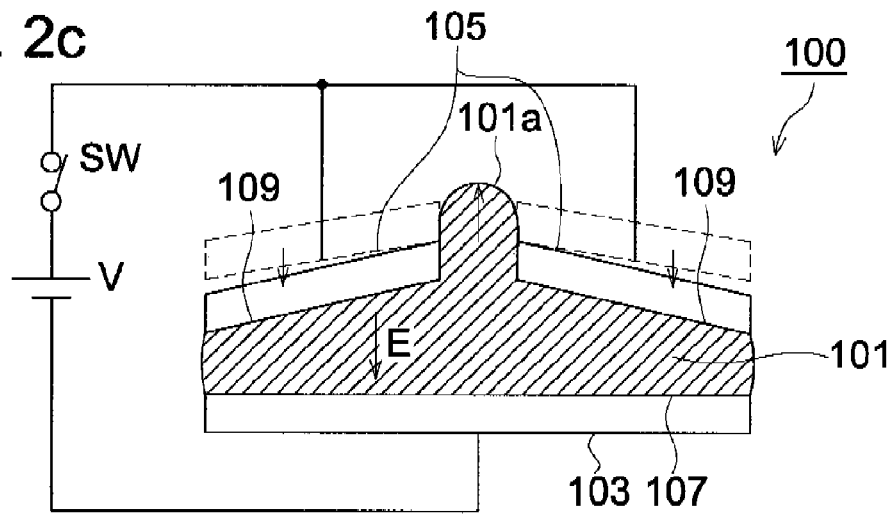

Next, a second embodiment of a polymer actuator of the present invention will be described using FIGS. 2a, 2b and 2c. FIGS. 2a, 2b and 2c are pattern diagrams showing the second embodiment of the polymer actuator. FIG. 2a shows the upper surface while FIG. 2b shows the side view of the actuator without application of electric field while FIG. 2c shows the side view with application of electric field.

In FIG. 2a, the upper surface electrode 105 of the polymer actuator 100 has an apertured electrode 106a having an elongated opening 111 at the center and the stretching portion 101 can be seen through the opening 111.

In FIG. 2b, the upper surface electrode 105 has the apertured electrode having the elongated opening 111 at the center. The stretching portion has a gradient in thickness, and the portion underneath the opening 111 is the thickest, and it becomes thinner as it approaches the periphery. The lower surface electrode 103 and the stretching portion 101 are bonded by adhesion and the like via the bonding surface 107, and similarly the upper surface electrode 105 and the stretching portion 101 are bonded by adhesion and the like via the bonding surface 109.

In FIG. 2c, when the switch SW is closed and potential difference V is applied to the lower surface electrode 103 and the upper surface electrodes 105, the electrostatic force caused by the electric field E due to the potential difference V acts between the lower surface electrode 103 and the upper surface electrodes 105 to cause the electrodes to attract each other. The electrostatic force is inversely proportional to the square of the gap between the electrodes. Therefore, the gap between the electrodes gets narrowed further in the area where the gap is small (periphery) than the area where the gap is large (underneath the opening 111).

The deformation of the stretching portion 101 caused by being pushed by the lower surface electrode 103 and the upper surface electrode 105 pushes the stretching portion 101 to be projected from the opening 111. The portion of the stretching portion 101 projected from the opening 111 is called an output portion 101a. The stretching portion 101 also stretches out from the peripheral portion, but because the gap between the electrodes is smaller in the peripheral portion, the amount of stretching of the stretching portion 101 is small. Thus in the second embodiment, the output direction of the drive force of the polymer actuator 100 is the direction in which a part of the stretching portion 101 protrudes from the elongate opening 111 at the center of the upper surface electrode 105.

In the polymer actuator 100 of the second embodiment, as is the case described in FIGS. 1a, 1b and 1c, the lower surface electrode 103 and the upper surface electrode 105 are formed of rigid material, and thus they do not deform, and only the stretching portion 101 is pushed to be projected from the opening 111.

In addition, as is the case in the first embodiment, because the electrostatic force that acts between the electrodes is stronger as the gap between the electrodes is smaller, and the attraction force is larger in the area where the gap is small (peripheral portion) than in the area where the gap is large (underneath the opening 111). Thus the shape and output direction of the output portion 101a of the polymer actuator 100 of the second embodiment is determined by the shape of the stretching portion 101 and the position and shape of the opening 111, and thus a special member or the like for determining output direction is not necessary.

Furthermore, the lower surface electrode 103 and the upper surface electrode 105 are formed of a rigid material, and there is no need for a support member such as a housing and the like for supporting the stretching portion 101, the lower surface electrode 103, and the upper surface electrode 105.

As described above, according to the second embodiment, the actuator forms the elongated output portion 101a by comprising the stretching portion 101 which has a gradient in thickness and the lower surface electrode 103 and the upper surface electrode 105 which are formed from a rigid material, and the elongate opening 111 at the upper surface electrode 105. As is the case of the first embodiment, there is provided the compact and low-cost polymer actuator 100, which is simply configured with a small number of parts without need for a support member or a special member for determining the output direction.

Figure 3A:
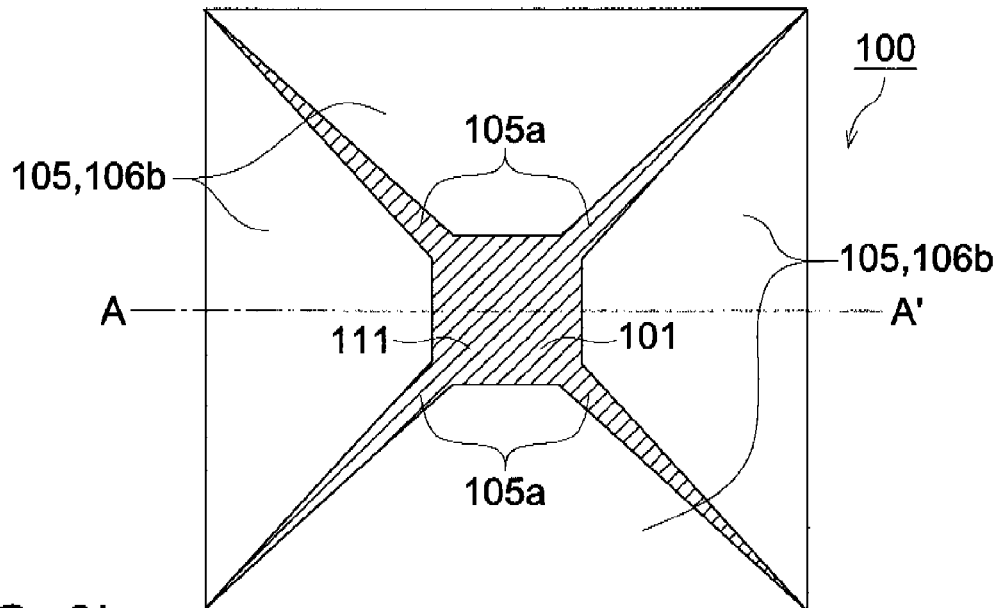
FIGS. 3a, 3b and 3c are pattern diagrams showing a polymer actuator according to a third embodiment of the present invention.
Figure 3B:
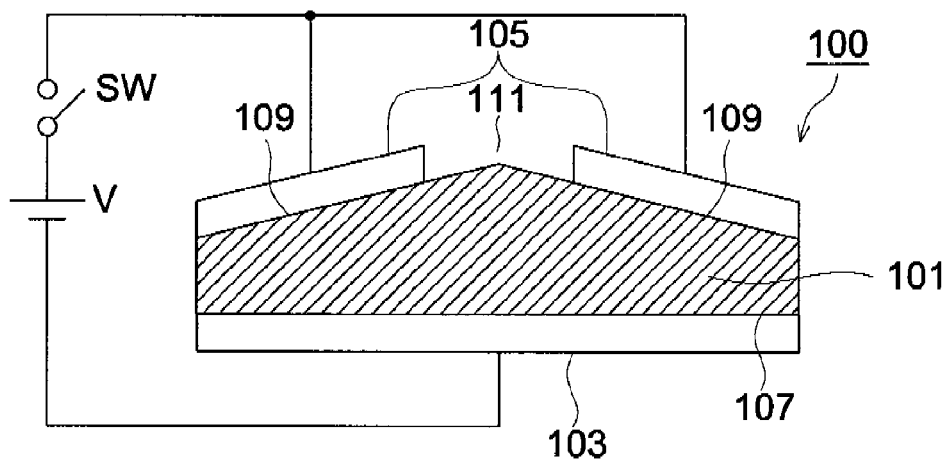
Figure 3C:
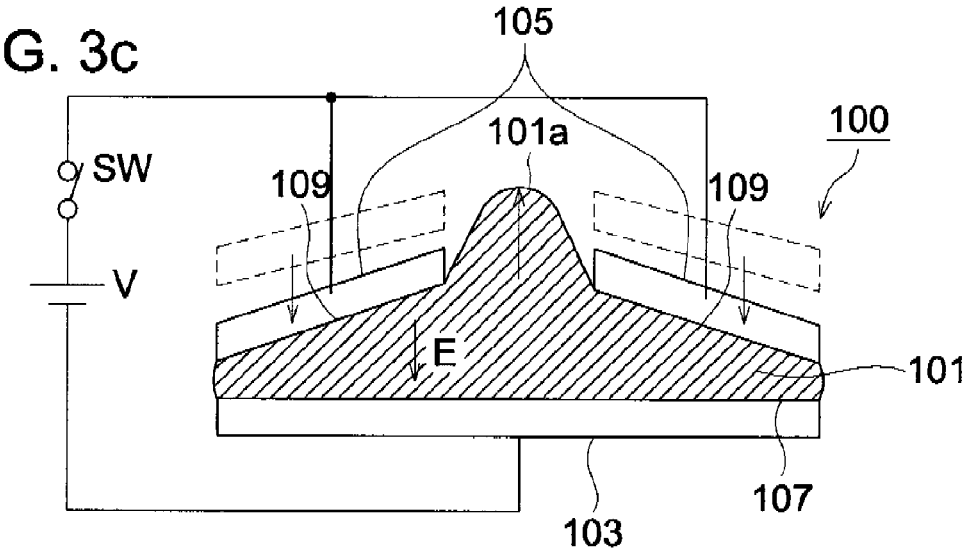

Next, a third embodiment of a polymer actuator of the present invention will be described using FIGS. 3a, 3b and 3c. FIGS. 3a, 3b and 3c are pattern diagrams showing the third embodiment of the polymer actuator, and FIG. 3a is a plan view, and FIG. 3b is a cross section along A-A' without application of the electric field, and FIG. 3c is a cross section along A-A' with application of an electric field.

In FIG. 3a, the upper surface electrode 105, which has the apertured electrode 106b, of the polymer actuator 100 is be divided into, for example, 4 regions, and the regions have notch portions 105a in order to prevent contact with each other from hindering the operation when the below described electric field E is applied. In addition, the upper surface electrode 105 has a rectangular opening 111, and the stretching portion 101 can be viewed through the notch portions 105a and the opening 111.

In FIG. 3b, the upper surface electrode 105 has an opening 111 at its center. The stretching portion has a gradient in thickness, and the portion underneath the opening 111 is the thickest, and it becomes thinner as it approaches the periphery. The lower surface electrode 103 and the stretching portion 101 are bonded by adhesion and the like via the bonding surface 107, and similarly, the upper surface electrode 105 and the stretching portion 101 are bonded by adhesion and the like via the bonding surface 109.

In FIG. 3c, when the switch SW is closed and potential difference V is applied to the lower surface electrode 103 and the upper surface electrodes 105, the electrostatic force caused by the electric field E dye to the potential difference V acts between the lower surface electrode 103 and the upper surface electrodes 105 to cause the electrodes to attract each other. The electrostatic force is inversely proportional to the square of the gap between the electrodes. Therefore, the gap gets narrowed further in the area where the gap is small (peripheral portion) than in the area where the gap is wide (underneath the opening 111).

The deformation of the stretching portion 101 pushed by the lower surface electrode 103 and the upper surface electrodes 105 pushes the stretching portion 111 to project from the opening 111 thus outputting a drive force in the direction of the projection. The projected portion from the opening 111 of the stretching portion 101 is called an output portion 101. The stretching portion 101 also stretches out from the peripheral portion. But the amount of stretching of the stretching portion 101 is small because the gap between the electrodes is smaller in the peripheral portion. Thus in the third embodiment, the output direction of the drive force of the polymer actuator 100 is the direction in which a part of the stretching portion 101 projects from the rectangular opening 111 at the center of the upper surface electrode 105.

In the polymer actuator 100 of the third embodiment, as is the case in the first and second embodiments, the lower surface electrode 103 and the upper surface electrode 105 are formed of rigid material, and thus they do not deform, and only the stretching portion 101 is pushed to be projected from the opening 111.

In addition, as is the case in the first and second embodiments, the electrostatic force that acts between the electrodes is stronger as the gap between the electrodes is smaller, and thus the electrodes attract each other stronger in the area where the gap is small (peripheral portion) than in the area where the gap is large (underneath the opening 111). Therefore, the shape and output direction of the output portion 101a of the polymer actuator 100 of the third embodiment is determined by the shape of the stretching portion 101 and the position and shape of the opening 111 without need for a special member or the like for determining the shape and output direction of the output portion 101a.

Furthermore, the lower surface electrode 103 and the upper surface electrode 105 are formed of a rigid material, and there is no need for a support member such as a housing and the like for supporting the stretching portion 101 and the lower surface electrode 103 and the upper surface electrode 105.

As described above, the third embodiment provides the rectangular output portion 101a by comprising the stretching portion 101 which has a gradient in thickness and the lower surface electrode 103 and the upper surface electrode 105 which are formed of a rigid material, and the rectangular opening 111 at the upper surface electrode 105. As is the case in the first and second embodiments, there is provided the compact and low-cost actuator 100 which is simply configured with a small number of parts without need for a special member for determining the shape and the output direction of the output portion 101a or a support member.

Figure 4A:
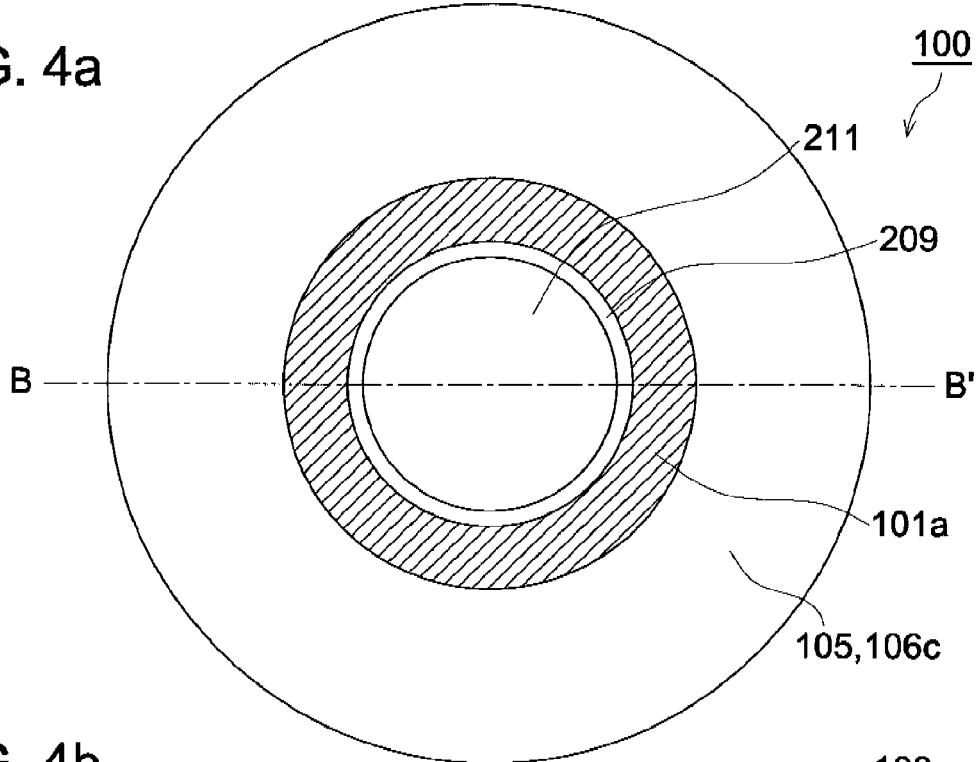
FIGS. 4a, 4b and 4c are pattern diagrams showing a polymer actuator according to a fourth embodiment of the present invention.
Figure 4B:
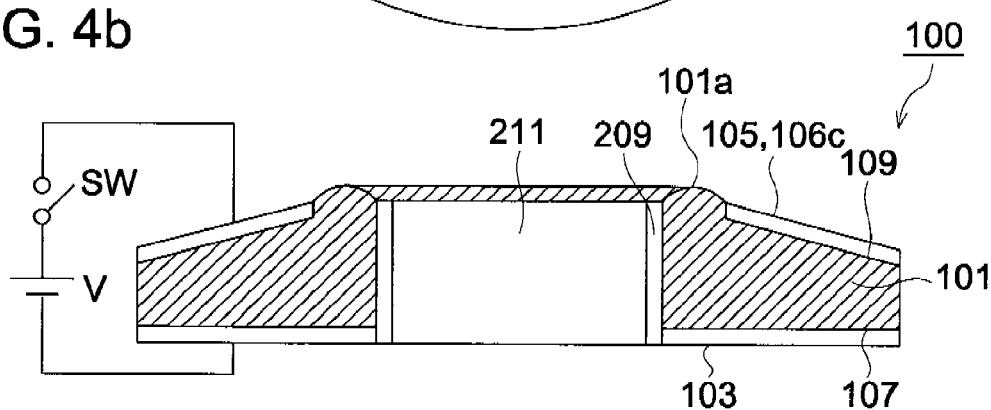
Figure 4C:
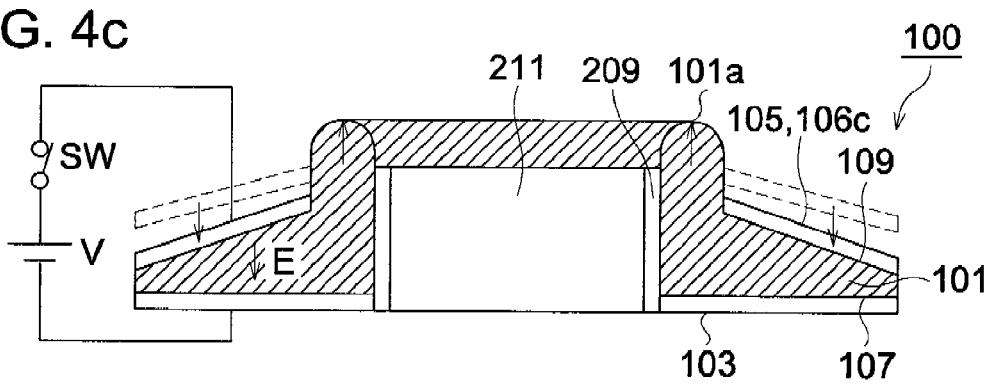

Next, a fourth embodiment of a polymer actuator of the present invention will be described using FIGS. 4a, 4b and 4c. FIGS. 4a, 4b and 4c are pattern diagrams showing the fourth embodiment of the polymer actuator, and FIG. 4a is a plan view, and FIG. 4b is a cross section along B-B' without application of the electric field and FIG. 4c is a cross section along B-B' with application of the electric field.

In FIG. 4a, the polymer actuator 100 has a donut shape and has at its center a circular opening that has an optical path 211 that is enclosed by a round inner wall 209. The upper surface electrode 105 which has the apertured electrode 106c also has a donut shape, and the output portion 101a of the stretching portion 101 projects from between the inner wall 209 and the upper surface electrode 105.

In FIG. 4b, the stretching portion 101 has a gradient in thickness, and the thickness is large at the center of the donut shape, and it becomes smaller as it approaches the periphery. The center of the donut shape of the stretching portion 101 has an output portion 101a which is erected in a donut shape, and the upper portion projects from between the inner wall 209 and the inner periphery of the upper electrode 105. The lower surface electrode 103 and the stretching portion 101 are bonded by adhesion and the like via the bonding surface 107, and similarly, the upper surface electrode 105 and the stretching portion 101 are bonded by adhesion and the like via the bonding surface 109. The inner wall 209 has a strength that allows it to resist pressure when the stretching portion stretches, and the surface of the inner wall 209 that contacts the stretching portion 101 is formed of a material that has little friction with the stretching portion 101 and does not impede the stretching of the stretching portion 101.

In FIG. 4c, when the switch SW is closed and potential difference V is applied to the lower surface electrode 103 and the upper surface electrodes 105, the electrostatic force is caused by the electric field E due to the potential difference V and acts between the lower surface electrode 103 and the upper surface electrodes 105. The electrostatic force is inversely proportional to the square of the gap between the electrodes. Therefore, the electrodes attract each other stronger and the gap gets narrowed further in the area where the gap is small (peripheral portion) than the area where the gap is large.

The deformation of the stretching portion 101 caused by being pressed by the lower surface electrode 103 and the upper surface electrode 105 stretches the stretching portion 101 to raise the output portion 101a in a ring shape. The stretching portion 101 also stretches out from the peripheral portion, but because the gap is small in the peripheral portion, the amount of the projection of the stretching portion 101 is small. Thus in the fourth embodiment, the output direction of the drive force of the polymer actuator 100 is the direction in which the output portion 101a projects.

In the polymer actuator 100 of the forth embodiment, as is the case in the first to third embodiments, the lower surface electrode 103 and the upper surface electrode 105 are formed of rigid material, and thus they do not deform, and only the output portion 101a of the stretching portion 101 is pushed to be projected from between the inner wall 209 and the upper electrode 105.

In addition, as is the case in the first to third embodiments, the electrostatic force that acts between the electrodes is stronger as the gap of the electrodes is smaller, and the electrodes attract each other stronger in the area where the gap is small (peripheral portion) than in the area where the gap is large (inner peripheral side of the donut shape). Thus the output direction of the drive force of the output portion 101a of the polymer actuator 100 of the fourth embodiment is determined by the shape of the stretching portion 101 and the position of the output portion 101a, and there is no need for a special member for determining the output direction of the drive force of the output portion 101a.

Furthermore, the lower surface electrode 103 and the upper surface electrode 105 are formed of a rigid material, and there is no need for a support member such as a housing and the like for supporting the stretching portion 101 and the lower surface electrode 103 and the upper surface electrode 105.

As described above, the fourth embodiment provides the ring shaped stretching portion 101 by comprising a stretching portion 101 which is formed in the shape of a donut which has an optical path 211 that is enclosed by a round inner wall 209 at the center thereof and has a gradient in thickness, the lower surface electrode 103 and the upper surface electrode 105 which are formed from a rigid material, and the output portion 101a at the inner peripheral side of the donut shape of the stretching portion 101. As is the case in the first to third embodiments, there is provided the compact and low-cost actuator 100 which is simply configured with a small number of parts without need for a support member or a special member for determining the shape and the output direction of the output portion 101a.

Figure 5A:
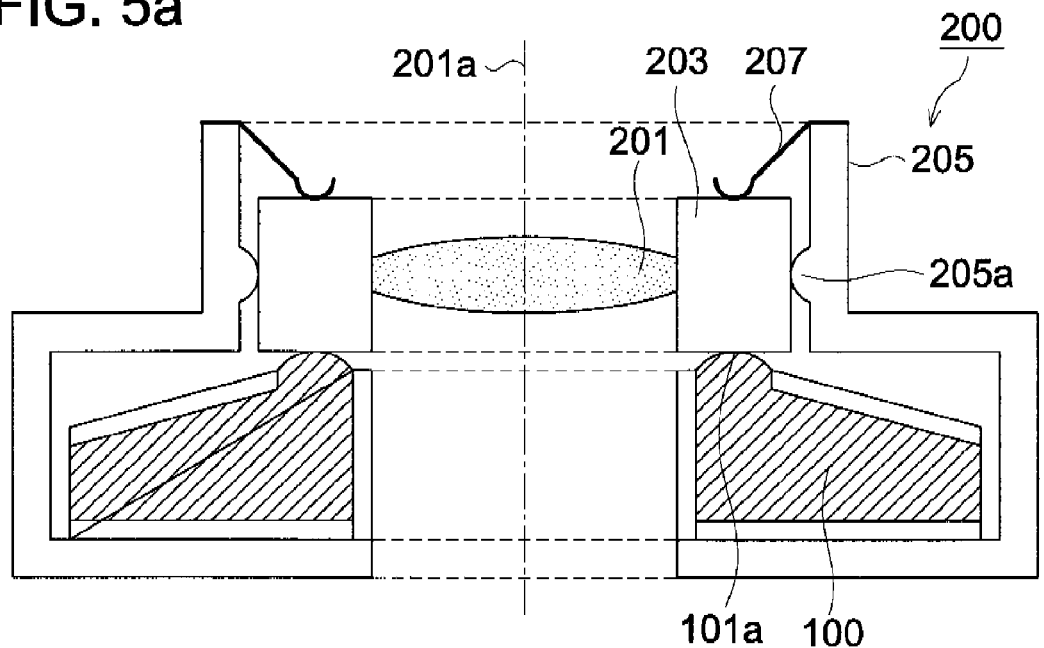
FIGS. 5a and 5b are pattern diagrams showing the lens driving unit which uses the polymer actuator according to the fourth embodiment of the present invention.
Figure 5B:
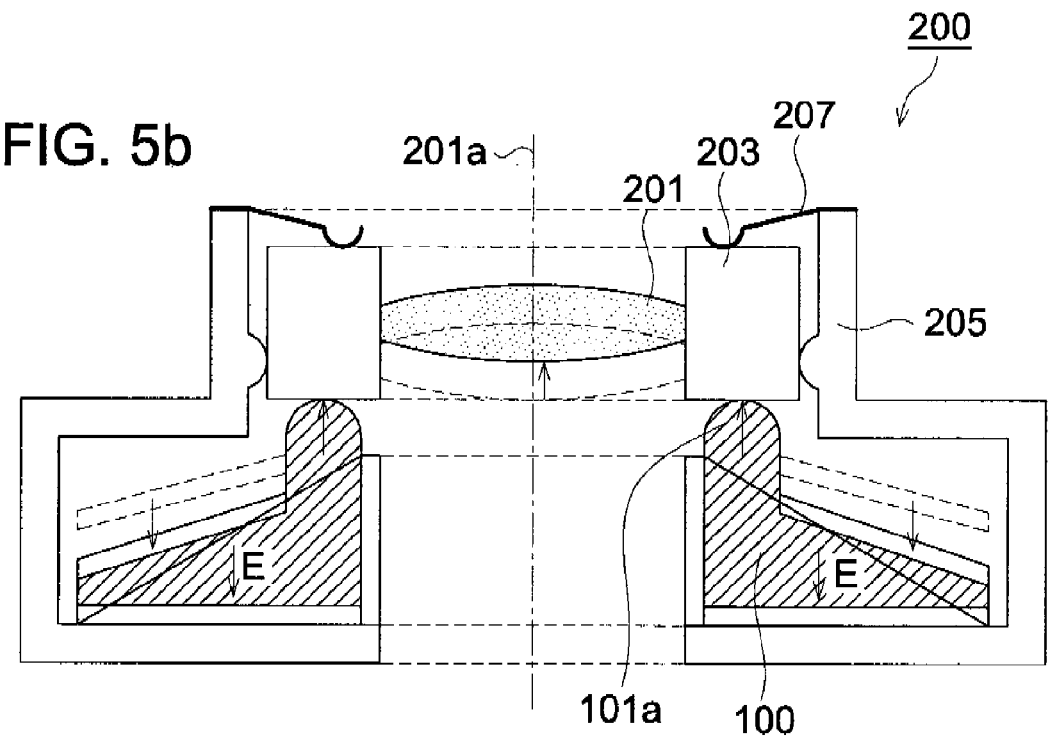

Next, the optical unit utilizing the fourth embodiment of the polymer actuator will be described using FIGS. 5a and 5b. FIGS. 5a and 5b are pattern diagrams showing the lens driving unit 200 which is an example of the optical unit which utilizes the fourth embodiment. FIG. 5a is a central section view of a lens driving unit 200 without application of electric field, and FIG. 5b is a central section view of the lens driving unit 200 with application of electric field.

In FIG. 5a, a lens 201 which functions as the optical system of the present invention is stored and supported in a lens frame 203 which functions as the frame member of the present invention. The lens frame 203 is stored inside a lens barrel 205 and is supported so as to be movable in the direction of an optical axis 201a by a projection portion 205a that is provided on the inner wall of the lens barrel 205. One surface in the optical axis 201a direction of the lens frame 203 is urged in the downward direction of the drawing by an urging spring 207 for example.

The other surface in the optical axis 201a direction of the lens frame 203 is in contact with the output portion 101a of the polymer actuator 100 of the fourth embodiment, and the lens frame 203 is sandwiched in the optical axis 201a direction by the urging spring 207 and the output portion 101a of the polymer actuator 100.

In FIG. 5b, when the electric field E is applied, as described in FIGS. 4a, 4b and 4c, the electrostatic force acts between the lower surface electrode 103 and the upper surface electrodes 105 to cause the electrodes to attract each other, and an output portion 101a is pushed to be projected upwardly by the both electrodes thus pushing the lens frame 203 upwardly against the force of the urging spring 207. As a result, the position of the direction of the optical axis 201a of the lens 201 is moved, or in other words, focus control becomes possible. The stretching amount, or in other words, the focus control position of the output portion 101a is controlled by changing the electric field E or the potential difference V in FIG. 4c.

According to the optical unit according to the fourth embodiment of the polymer actuator, a compact and low-cost optical unit can be provided by realizing the lens driving unit 200 with a simple structure in which the lens 201 supported by the lens frame 203 is sandwiched in the optical axis 201a direction by the urging spring 207 and the output portion 101a of the polymer actuator 100, and an electric field is applied between the electrodes of the polymer actuator 100.

Figure 6A:
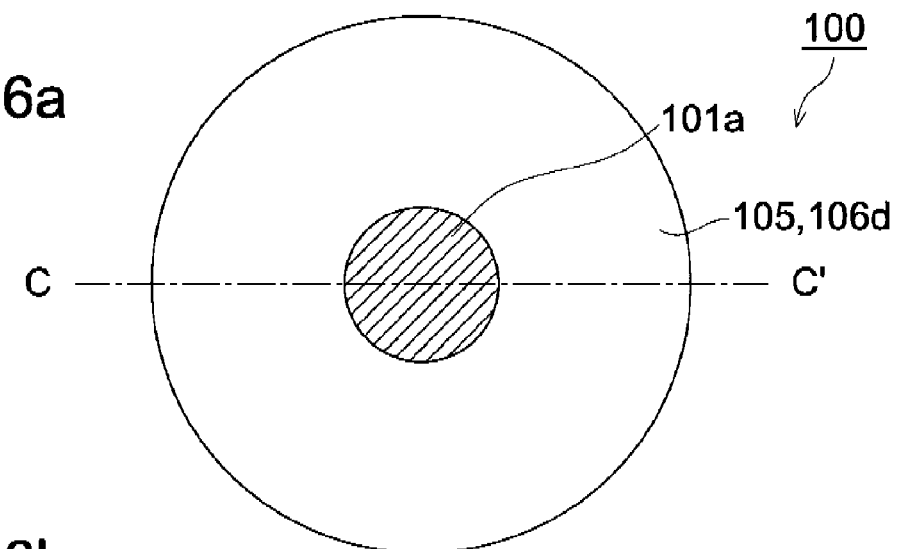
FIGS. 6a, 6b and 6c are pattern diagrams showing a polymer actuator according to a fifth embodiment of the present invention.
Figure 6B:
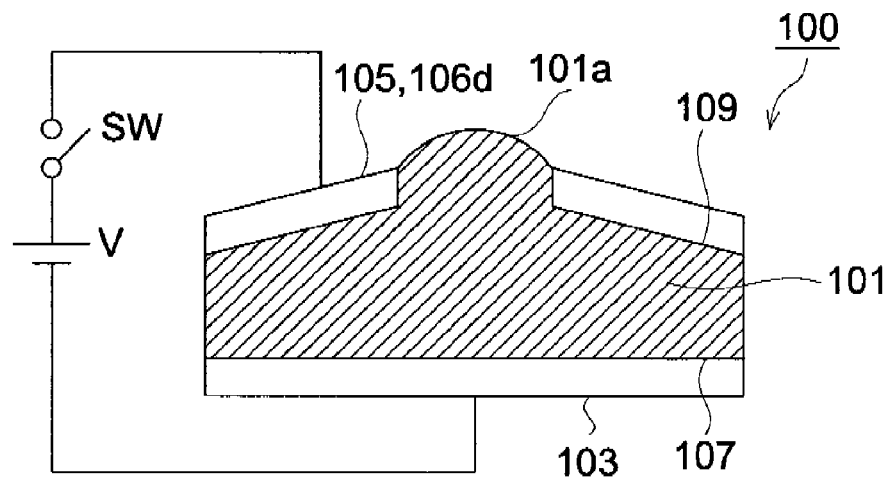
Figure 6C:
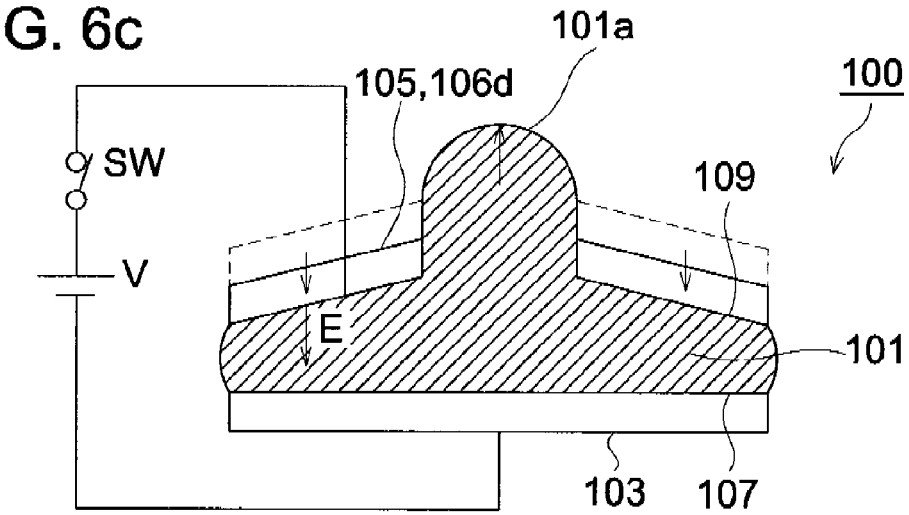

Next, a fifth embodiment of a polymer actuator of the present invention is described using FIGS. 6a, 6b and 6c. FIGS. 6a, 6b and 6c are pattern diagrams showing the fifth embodiment of the polymer actuator, and FIG. 6a is a plan view, and FIG. 6b is a cross section along C-C' without application of electric field, and FIG. 6c is a cross section along C-C' with application of electric field. As is the case in the first to fourth embodiments, in this embodiment also, the thickness of a stretching portion 101 has a gradient.

In FIG. 6a, a polymer actuator 100 has a circular outer shape. An upper surface electrode 105 that has an apertured electrode 106d is shaped as a cylinder having a circular opening at its center, and an output portion 101a of the stretching portion 101 projects from the opening portion of the upper surface electrode 105. The outer shape does not have to be circular and may be rectangular as is the case in the first to fourth embodiments and is arbitrarily selected as needed. The polymer actuator can be made by molding a dielectric polymer material using resin molding techniques, and thus it is easily formed in any desired shape.

In FIG. 6b, the stretching portion 101 is donut-shaped, and there is a gradient in the thickness in the electric field direction. The upper surface electrode 105 side of the center portion of the stretching portion 101 has an output portion 101a which is erected in a substantially semi-spherical shape, and it projects upward from the opening of the upper surface electrode 105. A lower surface electrode 103 and the stretching portion 101 are bonded by adhesion and the like via a bonding surface 107, and similarly the upper surface electrode 105 and the stretching portion 101 are bonded by adhesion and the like via a bonding surface 109. The output portion 101a does not need to be erected in a substantially semi-spherical shape, but may also be flat.

In FIG. 6c, when the switch SW is closed and potential difference V is applied to the lower surface electrode 103 and the upper surface electrodes 105, the electrostatic force caused by the electric field E due to the potential difference V acts between the lower surface electrode 103 and the upper surface electrodes 105 to cause the electrodes to attract each other. The stretching portion 101 is pushed by the lower surface electrode 103 and the upper surface electrodes 105 to be deformed, and the output portion 101a projects from the upper electrode 105 side. In this fifth embodiment, the output direction of the drive force of the polymer actuator 100 is the direction in which the output portion 101a projects.

In the polymer actuator 100 of the fifth embodiment, as is the case in the first to fourth embodiments, the lower surface electrode 103 and the upper surface electrode 105 are formed of rigid material, and thus they do not deform, and the output portion 101a of the stretching portion 101 is pushed to be projected from the opening of the upper electrode 105.

Furthermore, the lower surface electrode 103 and the upper surface electrode 105 are formed of a rigid material, and there is no need for a support member such as a housing and the like for supporting the stretching portion 101 and the lower surface electrode 103 and the upper surface electrode 105.

As described above, the fifth embodiment provides a projecting output portion 101a by comprising the stretching portion 101 which is cylindrical and has a gradient in thickness in the electric field direction, the output portion 101 which is projected in a substantially semi-spherical at its center portion, the lower surface electrode 103 which is formed from a rigid material, and the upper surface electrode 105 which has an opening at the center, thus having the shape such that the output portion 101a projects from the opening of the upper surface electrode 105. The compact and low-cost polymer actuator 100 which is simply configured with a small number of parts can be provided.

Figure 7A:
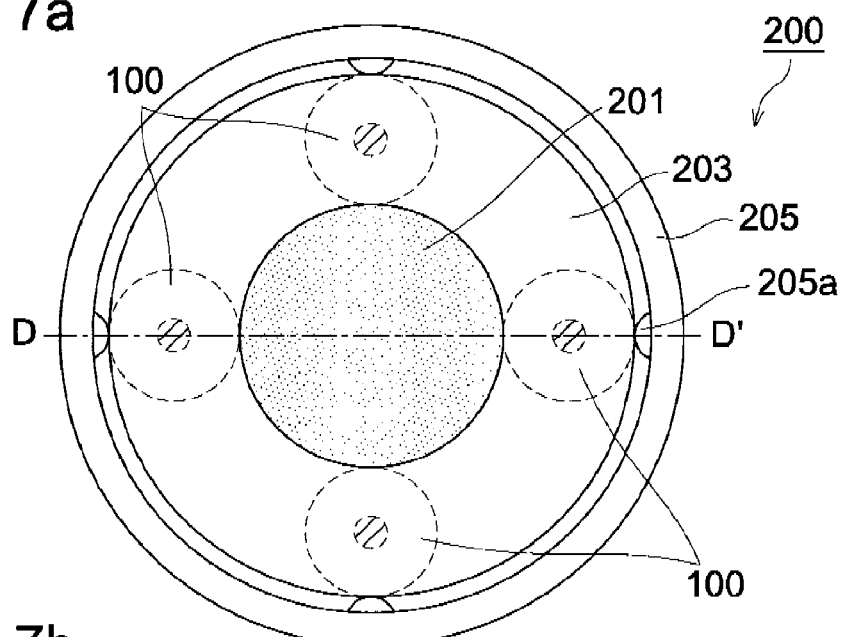
FIGS. 7a, 7b and 7c are pattern diagrams showing the lens driving unit which uses the polymer actuator according to a fifth embodiment of the present invention.
Figure 7B:
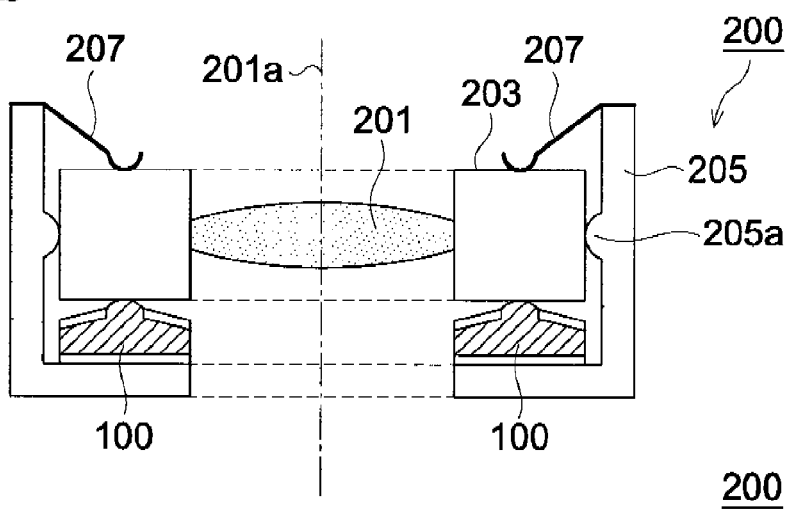
Figure 7C:
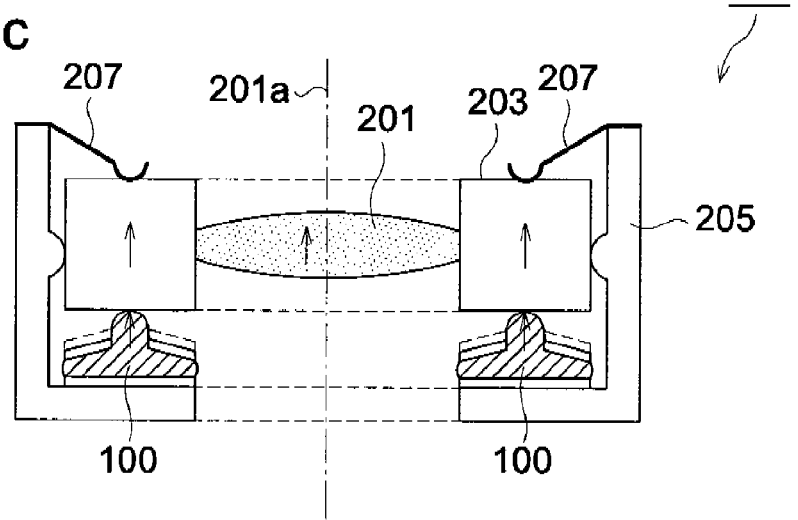

Next, the optical unit using the fifth embodiment of the polymer actuator will be described using FIGS. 7a, 7b and 7c. FIGS. 7a, 7b and 7c are pattern diagrams showing the lens driving unit 200 which is an example of the optical unit which utilizes the fifth embodiment. FIG. 7a shows the main portions viewed from above, FIG. 7b is a cross section along D-D' of the lens driving unit 200 without application of electric field, and FIG. 7c is a cross section along D-D' of lens driving unit 200 with application of electric field.

In FIG. 7a, a lens 201 which is an optical system of the present invention is stored and supported inside the cylindrical lens frame 203 which is the frame member of the present invention. The lens frame 203 is stored inside the lens barrel 205 and is supported to be movable in the optical axis 201a direction by a projection portion 205a that is provided on an inner wall of the lens barrel 205. A plurality of polymer actuators of the fifth embodiment shown in FIGS. 6a, 6b and 6c are disposed underneath the back surface side of the lens frame 203, for example four actuators are arranged at every 90° (at the positions of the vertices of a square). Of course, the arrangement does not have to be with four actuators at every 90°, and another arrangement, for example three actuators at every 120° (at the positions of the vertices of a triangle), may be employed.

In FIG. 7b, one surface in the optical axis 201a direction of the lens frame 203 may be urged in the downward direction of the drawing by an urging spring 207 for example. The other surface in the optical axis 201a direction of the lens frame 203 contacts an output portion 101a of the polymer actuator 100 of the fifth embodiment, and the lens frame 203 is sandwiched in the optical axis 201a direction by the urging spring 207 and the output portion 101a of the polymer actuator 100.

In FIG. 7c, when the electric field E is applied, as described in FIGS. 6a, 6b and 6c, the electrostatic force acts between the lower surface electrode 103 and the upper surface electrodes 105 to cause both electrodes to attract each other, which pushes out the output portion to project in the upward direction in the drawing thus pushing the lens frame upwardly against the force of the urging spring 207. As a result, the position of the direction of the optical axis 201a of the lens 201 is moved, or in other words, focus control becomes possible. The stretching amount, or in other words, the focus control position of the output portion 101a is controlled by changing the electric field E or the potential difference V in FIGS. 6a, 6b and 6c.

In addition, as shown in this example, when the structure of the embodiment is made to have a plurality of polymer actuators 100 to move the lens frame 203, the small polymer actuators can be used because the required force for each polymer actuator is small, which contributes the lens driving unit 200 to be small.

Furthermore, by controlling the potential difference V applied to the polymer actuators 100 to be different for different polymer actuator, the lens frame 203 can be tilted or in other words, the optical axis 201a can be tilted. As a result, not only focus control, but also handshaking correction becomes possible, and advanced photography techniques such as tilt photography become possible.

According to the optical unit using the fifth embodiment of the polymer actuator described above, a compact and low cost optical unit is provided by realizing the lens driving unit 200 with a simple structure in which the lens 201 that is supported by the lens frame 203 is sandwiched in the optical axis 201a direction by the urging spring 207 and the output portions 101a of a plurality of polymer actuators 100, and an electric field is applied to the electrodes of the polymer actuator 100. Furthermore, not only focus control, but also handshaking correction becomes possible, and advanced photography techniques such as tilt photography become possible.

As described above, according to the present embodiment, by including a stretching portion that has a gradient in thickness and electrodes that is inelastic in a planar direction, there is no need for a special member for determining the output direction or a support member, and there can be provided a compact and low-cost polymer actuator which is simply configured with a small number of parts, and an optical unit including the polymer actuator can be provided.

It is to be noted that the detailed structure and operation of the polymer actuator of the embodiments of the present invention and the components of the optical unit including the polymer actuator can be modified as needed without departing from the spirit of the present invention.

What is claimed is:

1. A polymer actuator, comprising:
   a stretching portion which is made of a dielectric polymer material;
   a pair of electrodes for sandwiching the stretching portion and applying an electric field to the stretching portion; and
   an opening portion at least partially defined by at least one of the electrodes,
   wherein the stretching portion has a gradient in thickness in a portion between the electrodes in the absence of an applied electric field, and
   wherein the stretching portion includes an output portion configured to protrude from the opening portion according to an applied electric field.

2. The polymer actuator of claim 1, wherein at least one of the electrodes is inelastic in a planar direction thereof.

3. The polymer actuator of claim 1, wherein at least one of the electrodes is rigid.

4. The polymer actuator of claim 1, wherein at least one of the electrodes includes:
   a conductive layer; and
   a rigid layer stacked on the conductive layer.

5. The polymer actuator of claim 1, wherein the output portion is configured to protrude in a direction perpendicular to the electric field so as to output a driving force.

6. The polymer actuator of claim 1, wherein the opening portion is provided as an aperture in one of the electrodes, and the output portion is configured to protrude from the opening portion to output a driving force.

7. The polymer actuator of claim 6, wherein the opening portion has an elongated shape.

8. The polymer actuator of claim 6, wherein the opening portion has a rectangular shape.

9. The polymer actuator of claim 6, wherein the opening portion has a circular shape.

10. An optical unit, comprising:
    an optical system;
    a frame member for supporting the optical system; and
    a polymer actuator for moving the member, the polymer actuator including:
       a stretching portion which is made of a dielectric polymer material;
       a pair of electrodes for sandwiching the stretching portion and applying an electric field to the stretching portion; and
       an opening portion at least partially defined by at least one of the electrodes,
       wherein the stretching portion has a gradient in thickness in a portion between the electrodes in the absence of an applied electric field, and
       wherein the stretching portion includes an output portion configured to protrude from the opening portion according to an applied electric field.

11. The optical unit of claim 10, wherein the opening portion is provided as an aperture in one of the electrodes and the output portion is configured to protrude from the opening portion to output a driving force.

12. The polymer actuator of claim 1, wherein the gradient is such that the thickness of the stretching portion is greater at the center of the stretching portion than at the periphery of the stretching portion.

13. A polymer actuator, comprising:
    a pair of electrodes;
    a stretching element at least partially disposed between the electrodes, said stretching element having a thickness gradient across a lateral extent thereof in the absence of an applied electric field,
    wherein at least one of the electrodes includes an aperture therethrough, and
    wherein said actuator is configured so that upon the application of an electric field said stretching element is at least partially compressed between said electrodes and deforms so that at least a portion of said stretching element protrudes through the aperture.

14. The polymer actuator of claim 13, further comprising:
    a cylindrical element provided at least partially within the aperture, said cylindrical element being arranged such that upon application of an electric field, the stretching element protrudes between the cylindrical element and the aperture.

* * * * *